United States Patent
Tu

(10) Patent No.: US 7,329,953 B2
(45) Date of Patent: Feb. 12, 2008

(54) STRUCTURE FOR REDUCING LEAKAGE CURRENTS AND HIGH CONTACT RESISTANCE FOR EMBEDDED MEMORY AND METHOD FOR MAKING SAME

(75) Inventor: Kuo-Chi Tu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 254 days.

(21) Appl. No.: 10/696,006

(22) Filed: Oct. 29, 2003

(65) Prior Publication Data
US 2005/0093147 A1    May 5, 2005

(51) Int. Cl.
*H01L 31/0232* (2006.01)
*H01L 23/48* (2006.01)
*H01L 21/4763* (2006.01)
*H01L 21/44* (2006.01)

(52) U.S. Cl. ............... 257/758; 257/437; 257/759; 257/760; 257/774; 438/622; 438/623; 438/624; 438/625; 438/626; 438/629; 438/636; 438/637; 438/638; 438/672; 438/675

(58) Field of Classification Search ............ 438/618, 438/622, 636, 637, 666; 257/773, 774, 775
See application file for complete search history.

(56) References Cited

U.S. PATENT DOCUMENTS

| | | | |
|---|---|---|---|
| 6,040,619 A * | 3/2000 | Wang et al. | 257/649 |
| 6,051,870 A * | 4/2000 | Ngo | 257/519 |
| 6,083,825 A * | 7/2000 | Lin et al. | 438/629 |
| 6,130,154 A * | 10/2000 | Yokoyama et al. | 438/627 |
| 6,342,734 B1 * | 1/2002 | Allman et al. | 257/758 |
| 6,403,417 B1 | 6/2002 | Chien et al. | 438/241 |
| 6,483,162 B2 * | 11/2002 | Kwon et al. | 257/437 |
| 6,485,988 B2 | 11/2002 | Ma et al. | 438/3 |
| 6,504,202 B1 * | 1/2003 | Allman et al. | 257/303 |
| 6,576,546 B2 * | 6/2003 | Gilbert et al. | 438/629 |
| 6,724,085 B2 * | 4/2004 | Tomita | 257/758 |
| 6,774,425 B2 * | 8/2004 | Lachner et al. | 257/306 |
| 6,884,651 B2 * | 4/2005 | Toyoda et al. | 438/72 |
| 6,939,812 B2 * | 9/2005 | Broekaart et al. | 438/740 |
| 6,960,529 B1 * | 11/2005 | Nelson et al. | 438/696 |
| 2002/0079581 A1 * | 6/2002 | Graettinger et al. | 257/748 |
| 2002/0096772 A1 * | 7/2002 | Ikemasu et al. | 257/758 |
| 2002/0182847 A1 * | 12/2002 | Yokoyama et al. | 438/622 |

\* cited by examiner

*Primary Examiner*—Carl Whitehead, Jr.
*Assistant Examiner*—James M Mitchell
(74) *Attorney, Agent, or Firm*—Thomas, Kayden, Horstemeyer & Risley

(57) ABSTRACT

A method for fabricating an insulating layer having contact openings of varying depths for logic/DRAM circuits is achieved using a single mask and etch step. After forming stacked or trench capacitors, a planar insulating layer is formed. Contact openings are etched in the planar insulating layer to the substrate, and contact openings that extend over the edge of the stacked or trench capacitor top electrode, having an ARC, are etched using a novel mask design and a single etching step. This allows one to make contacts to the substrate without overetching while making low-resistance contacts to the sidewall of the capacitor top electrode. In the trench capacitor open areas are formed to facilitate making contact openings that extend over the top electrode. A series of contact openings that are skewed or elongated also improve the latitude in alignment tolerance.

17 Claims, 9 Drawing Sheets

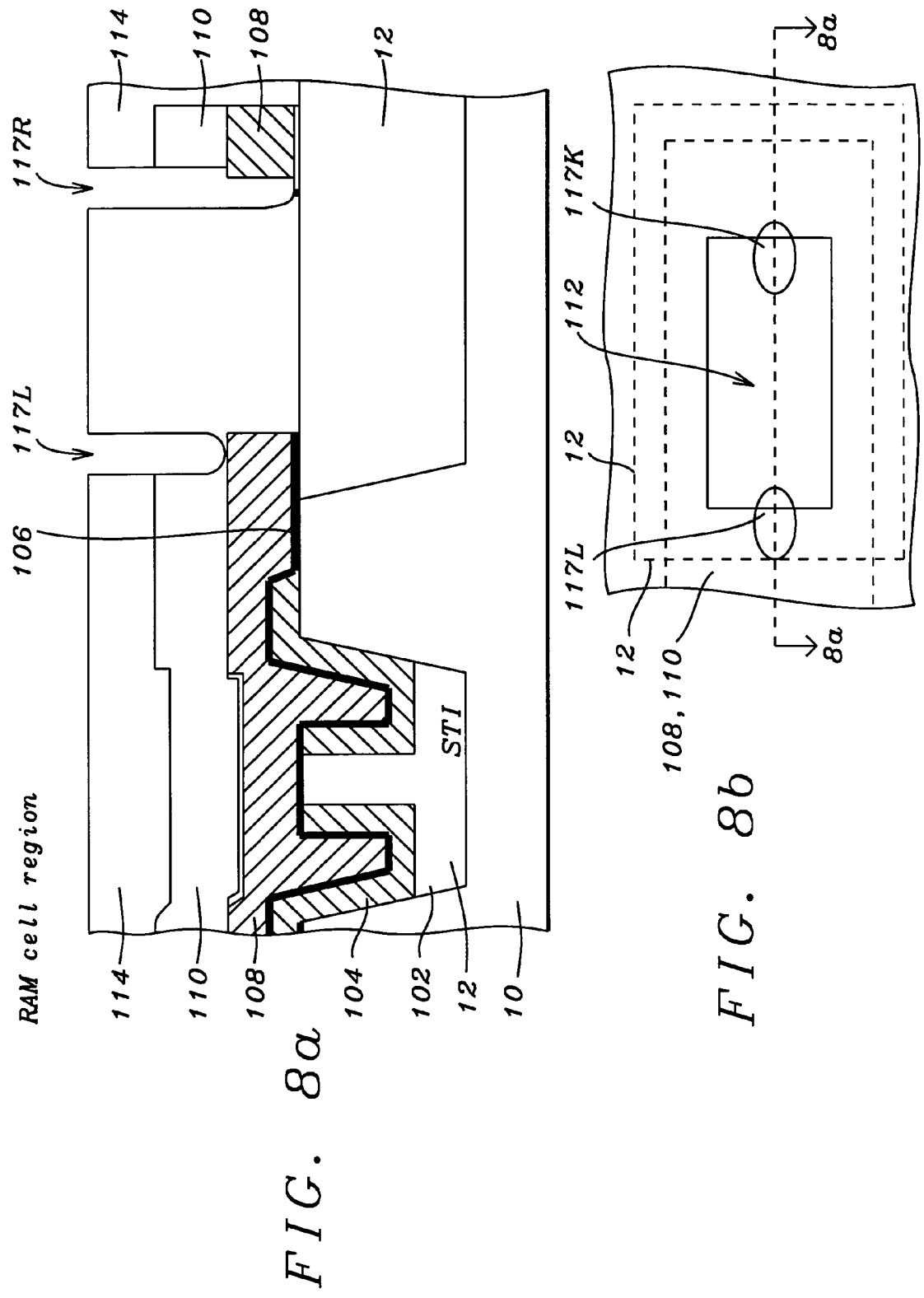

STRUCTURE FOR REDUCING LEAKAGE CURRENTS AND HIGH CONTACT RESISTANCE FOR EMBEDDED MEMORY AND METHOD FOR MAKING SAME

BACKGROUND OF THE INVENTION (1) Field of the Invention

This invention relates to semiconductor integrated circuit devices, and more particularly to a structure and method for making contact openings for embedded dynamic random access memory (DRAM) circuits. The structure and process are particularly useful for making contact openings in an insulating layer to the top electrode of the DRAM capacitor with low contact resistance, while concurrently etching contact openings to the substrate for bit-line contact openings and for contact openings to the logic areas without overetching the contact areas which would otherwise result in high leakage currents.

(2) Description of the Prior Art

Integrated logic and DRAM structures, also referred to as embedded memory, are becoming increasingly important for future product applications. These advanced circuits require field effect transistors (FETs) with shallower diffused junctions in logic areas to improve performance, while forming DRAM capacitors having reduced size and low-electrical-contact resistance to the top electrode. However, when a single masking step is used, it is difficult to make contacts to shallow diffused junctions for the FETs without overetching, while concurrently forming low-electrical-resistance contacts to the DRAM capacitor. This problem for a conventional (prior-art) logic/DRAM integrated structure using stacked capacitors is best described with reference to FIG. 1, in which the logic area is shown on the left (labeled Logic), and the DRAM area with stacked capacitors is depicted on the right (labeled DRAM). A typical structure consists of a semiconductor substrate 10 in which shallow trench isolation 12 is formed to electrically isolate the device areas. FETs are formed by growing a gate oxide 16, and by depositing a polysilicon layer and patterning to form gate electrodes 18. Lightly doped drains 24 are implanted, sidewall spacers 22 are formed on the gate electrodes, and another implant is used to form the source/drain contact areas 25. A metal silicide is then used, such as in a salicide process, to make contacts 26 to the gate electrodes 18, to the shallow source/drain contact areas 25, and bit-line contacts, also labeled 25, in the DRAM area. Next, a planar insulating layer 28 is formed over the FETs. Storage node contacts 30 are formed in the insulating layer 28 for capacitor bottom electrodes 32 in the DRAM area. The capacitors are completed by depositing sequentially an interelectrode dielectric layer 34, depositing a conducting layer for top electrodes 36, and forming an anti-reflective coating (ARC) 38, and patterning. A second insulating layer 40 is then deposited and planarized over the capacitors. More specifically, the problem arises when a single mask is used to etch the contact openings 1 of varying depths to the shallow diffused junctions 25 and through the ARC 38 to the capacitor top electrodes 36. In order to etch through the ARC 38 at the region R in opening 1 for low contact resistance, the shallow diffused junctions 25 can be overetched resulting in high-leakage currents. The conventional process that utilizes two separate masking and etching steps is not cost-effective and can cause alignment problems on integrated circuits having 0.1 micron (um) minimum feature sizes.

This problem also arises for conventional trench capacitors as depicted in FIG. 2. In FIG. 2 the RAM cell region is depicted on the left, and the logic region is depicted on the right. In this approach shallow trench isolation 12 is formed in a substrate 10. FET devices are formed similar to the process for making the logic/DRAM structures having stacked capacitors. In this approach, the trench capacitors are formed by recessing the STI 12, and forming bottom electrodes 104 in the recesses. Next, a stacked layer composed of an interelectrode dielectric layer 106, a conducting layer 108, and an anti-reflective coating (ARC) 110 is deposited. The stacked layer is patterned to form the top electrodes 108, having the ARC 110 on the surface, for the trench capacitors. Then an insulating layer 114 is deposited and planarized. Next, a single mask and etching step are used to form contact openings 116 of varying depths to make contact to the diffused junctions 25, to the gate electrodes 18, and to the capacitor top electrodes 108. However, when the contact openings 116 are etched down to the shallow diffused junctions 25, the contact opening etched to the capacitor top electrode is not completely etched through the ARC 110, resulting in high contact resistance, as indicated by the point R in FIG. 2. If the contact openings 116 are etched through the ARC 110 to make good ohmic contact, the contact openings 116 to the shallow diffused junctions 25 are overetched resulting in damage (high-leakage currents).

Several methods for making contact openings to capacitors for logic/DRAM circuits have been reported in the literature. For example, in U.S. Pat. No. 6,403,417 B1 to Chien et al., a method is described for making via holes and strip contact holes for embedded memory. In their approach the via holes and the contact holes are formed separately in the dielectric layer. Chien et al. are silent about using a single masking step. In U.S. Pat. No. 6,485,988 B2 to Ma et al., a method is described for using a hydrogen-free contact etch for ferroelectric capacitor formation. Ma et al. are also silent about using a single masking step for forming contact openings to varying depths.

However, there is still a need in the semiconductor industry to provide a process for making logic circuits with embedded DRAM devices using a single mask for etching contact openings of varying depths without resulting in high contact resistance to capacitor top electrodes and high leakage currents to shallow diffused junctions on/in the substrate surface.

SUMMARY OF THE INVENTION

A principal object by a first embodiment of the present invention is to provide an insulating layer having contact openings of varying depths on a merged logic/DRAM structure with stacked capacitors, whereby contacts with low-leakage current are formed to the substrate, while concurrently contacts with low-contact resistance are formed to the capacitor top electrodes having an ARC layer on the surface.

A second objective of the present invention is to provide contact openings that partially extend over the edge of the capacitor top electrodes of the DRAM thereby providing for low-contact-resistance contacts to the sidewalls of the top electrodes of the DRAM capacitors.

A third objective of the present invention is to form the contact openings of varying depths using a single masking step thereby eliminating the need for additional masking steps and also reducing manufacturing costs.

Another objective by a second embodiment of this invention is to provide an insulating layer having contact openings of varying depths on a merged logic/DRAM structure with trench capacitors, whereby contacts with low-leakage current are formed to the substrate, while concurrently contacts with low-contact resistance are formed to the capacitor top electrodes having an ARC layer on the surface.

Another objective of the present invention by a second embodiment is to form open areas in an ARC layer and in the underlying top electrodes down to the trench isolation regions on the substrate, which allows contact openings to be etched in an overlying planar insulating layer down to and extending over the edges of the open areas in the top electrodes, thereby providing for contacts having low-contact resistance to the sidewalls of the top electrodes.

Still another objective by a second embodiment is to form a series of skewed and/or elongated contact openings in an insulating layer along the edges of the open areas in the top electrodes to provide greater latitude in misalignment when forming contacts having low-contact resistance.

A further objective of the second embodiment is to form the contact openings of varying depths using a single masking step thereby eliminating the need for additional masking steps and also reducing manufacturing costs.

The method for achieving the above objectives for these improved embedded DRAM/logic circuits starts by providing a semiconductor substrate. Typically the substrate is a P$^-$ doped single-crystal silicon having a <100> crystallographic orientation. A field oxide is formed using shallow trench isolation (STI) to surround and electrically isolate device areas, having semiconductor devices, in logic regions and DRAM regions on and in the substrate. Typically the semiconductor devices are FETs having gate electrodes, a gate oxide, and source/drain areas. The FETs include a self-aligned silicide on the gate electrodes and the source/drain areas. A first insulating layer is deposited on the substrate and planarized. Node contact openings are etched in the planar first insulating layer to the devices in the memory region, and node contacts are formed for capacitor bottom electrodes. A first conducting layer is deposited and patterned to form bottom electrodes over the node contacts. A stacked layer comprised of an inter-electrode dielectric layer, a second conducting layer, and an anti-reflective coating is deposited sequentially over the bottom electrodes. The stacked layer is patterned to form capacitor top electrodes, and exposes the sidewalls of the second conducting layer. A second insulating layer is deposited on the substrate and over the top electrodes and planarized. One key feature of this invention is to use a single masking step to etch contact openings of varying depths in the second and first insulating layers for contacts to the FET gate electrodes and source/drain areas on the substrate in the logic region and memory region. A second key feature of this invention is to modify the design of the etch mask to etch contact openings that extend over and along the edge of the top electrodes to expose the second conducting layer and provide a means for forming contacts having low contact resistance to sidewalls of the top electrodes. The contact openings can now be etched to the substrate without overetching, which would damage the contacts on the substrate, while providing openings for low-resistance contacts to the capacitor top electrodes.

The method by a second embodiment is described for making contact openings of varying depths in an insulating layer on a substrate for merged logic/memory having trench capacitors. The method begins similar to the first embodiment up to and including the formation of the shallow trench isolation. After forming the trench isolation, semiconductor devices, such as FETs, are formed in device areas. Next, recesses are formed in the shallow trench isolation in the memory regions (RAM) for trench capacitors. A conformal first conducting layer is deposited and patterned to form capacitor bottom electrodes in the recesses. A stacked layer comprised of an interelectrode dielectric layer, a second conducting layer, and an anti-reflective coating (ARC) is deposited over the bottom electrodes. The stacked layer is patterned to form capacitor top electrodes from the second conducting layer. A key feature is to form open areas in the stacked layer during patterning of the top electrodes. During patterning the sidewalls of the second conducting layer are exposed within the open areas. An insulating layer is deposited on the substrate and over the top electrodes having the ARC. The insulating layer is planarized. Another key feature is to use a novel mask design and a single masking step to etch contact openings of varying depths in the planar insulating layer for contacts to the FETs on the substrate and, in the memory regions (RAM), concurrently etching contact openings extending over and along the edge of the top electrodes in the open areas to expose the second conducting layer. This etching step allows one to etch contact openings to the substrate without overetching, while providing a means for forming contacts having low-contact resistance to the sidewalls of the top electrodes. Another feature of the mask design is to form a series of contact openings, for example, two contact openings are etched over the edge of the patterned second conducting layer in the open areas on opposite sides of the open areas to allow for more relaxed alignment tolerances. Another method is to form a series of contact openings that are skewed along the edges of the patterned second conducting layer on opposite sides of the open areas to also provide for more relaxed alignment tolerances. Further, a series of contact openings that are elongated normal to the edge of the patterned second conducting layer can be formed to also relax the alignment tolerances.

BRIEF DESCRIPTION OF THE DRAWINGS

The above objects and advantages of this invention are best understood with reference to the attached drawings in the figures.

FIGS. 6, 7, 8A and 8B are schematic cross-sectional views showing the sequence of process steps for making contact openings of varying depths, by a second embodiment, for making a logic/memory circuit without having overetched contacts to the substrate, while having low-contact resistance openings to the top electrode of a trench capacitor.

DESCRIPTION OF THE PREFERRED EMBODIMENT

The method for making contact openings of varying depths in a planar insulating layer on a substrate having logic/memory circuits using a single masking and etching step is now described in detail. The method results in contacts that are damage-free at the substrate surface while providing contact openings for low-contact resistance to capacitor top electrodes with an anti-reflective coating (ARC). Although the invention is described for making contacts to top electrodes of a stacked or a trench capacitor, it should be understood by those skilled in the art that the contact openings can be made, in general, to a conducting layer having an ARC on the surface. However, the method is particularly useful for making low-resistance contacts to capacitor top electrodes.

Figure 1:
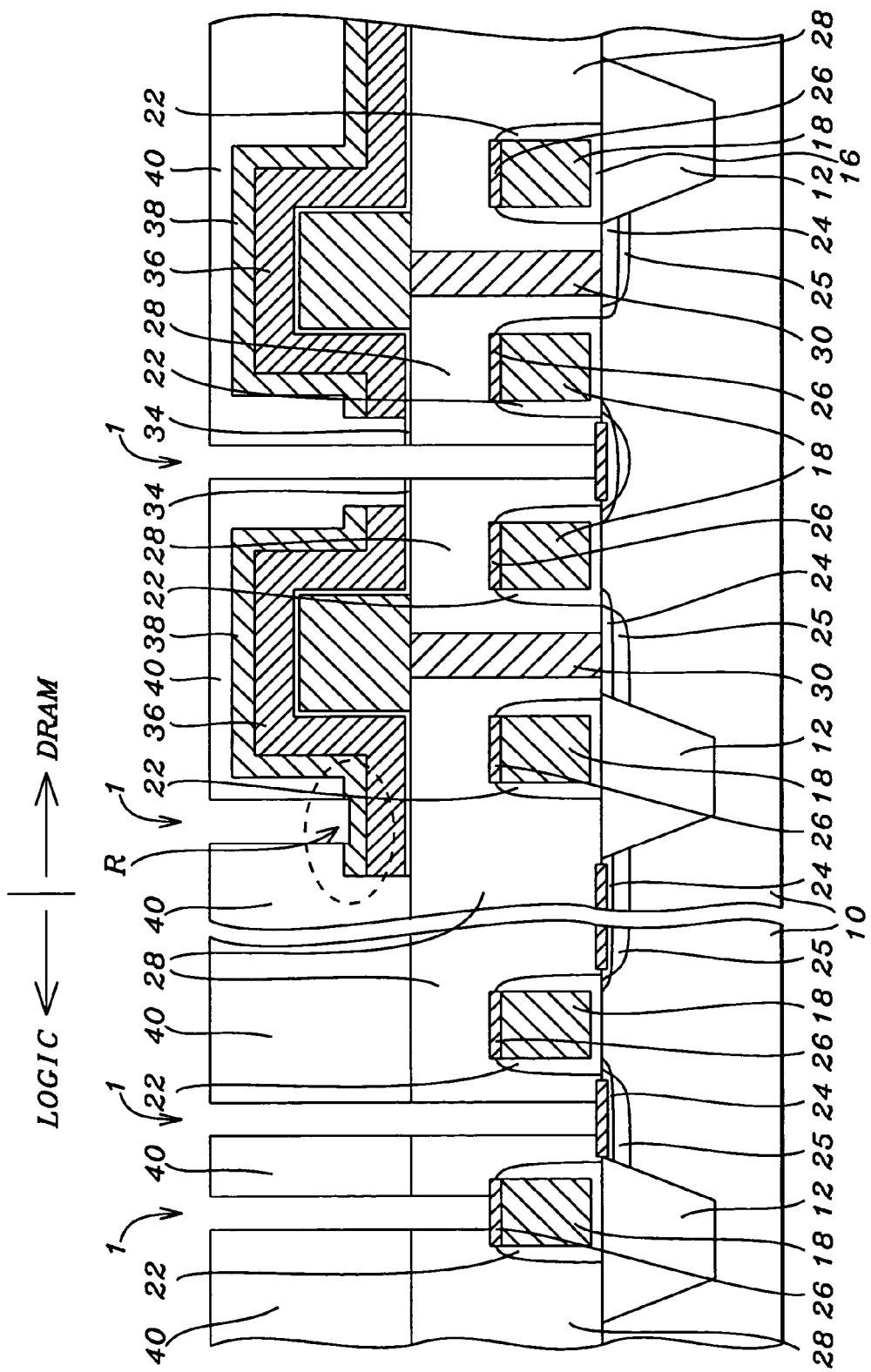
FIGS. 1 and 2 are schematic cross-sectional views showing a portion of a logic/memory circuit for a prior art that shows contact openings that would result in overetched substrate contacts or high-contact resistance to a capacitor top electrode for a stacked capacitor or a trench capacitor, respectively.
Figure 2:
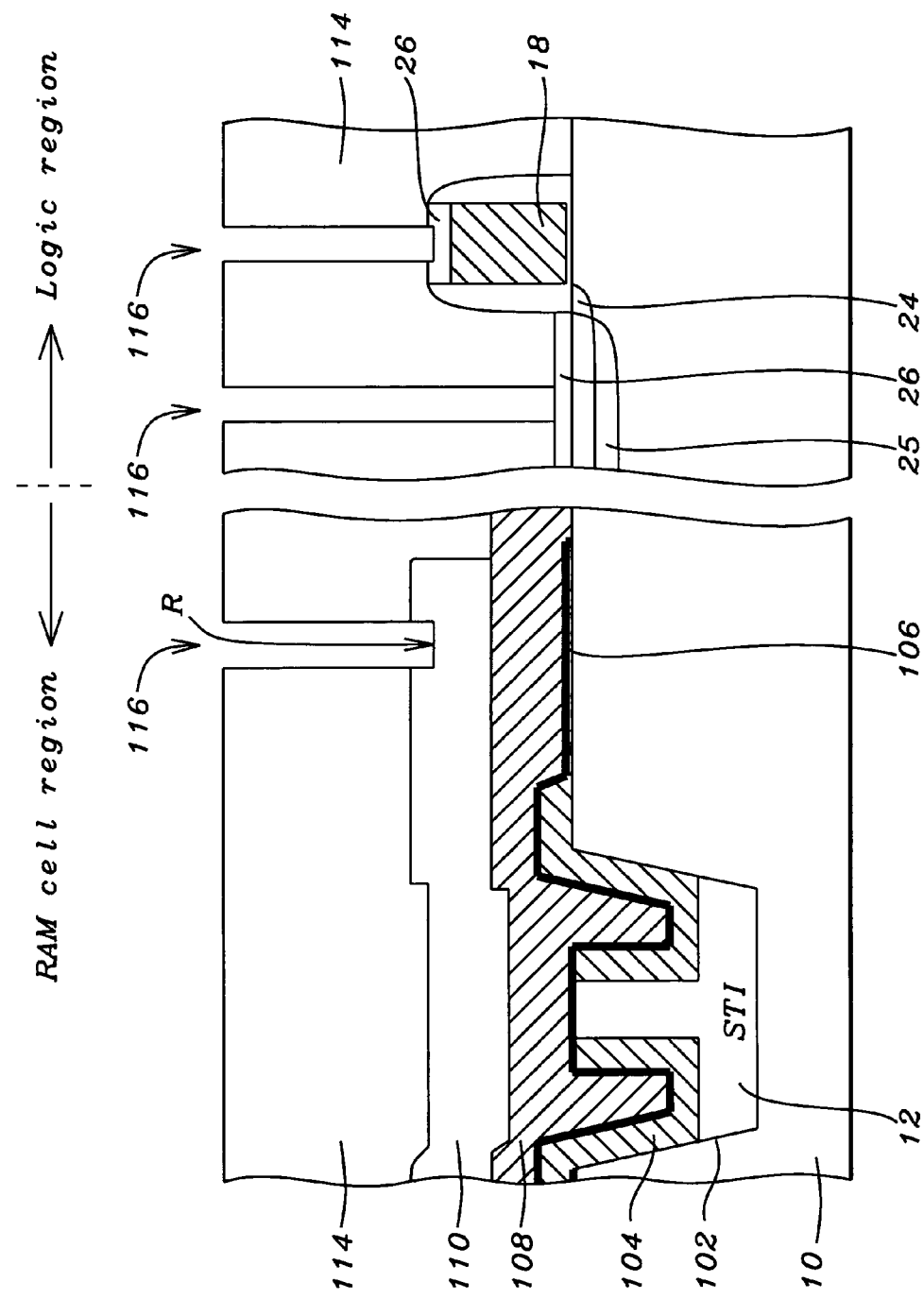
Figure 3:
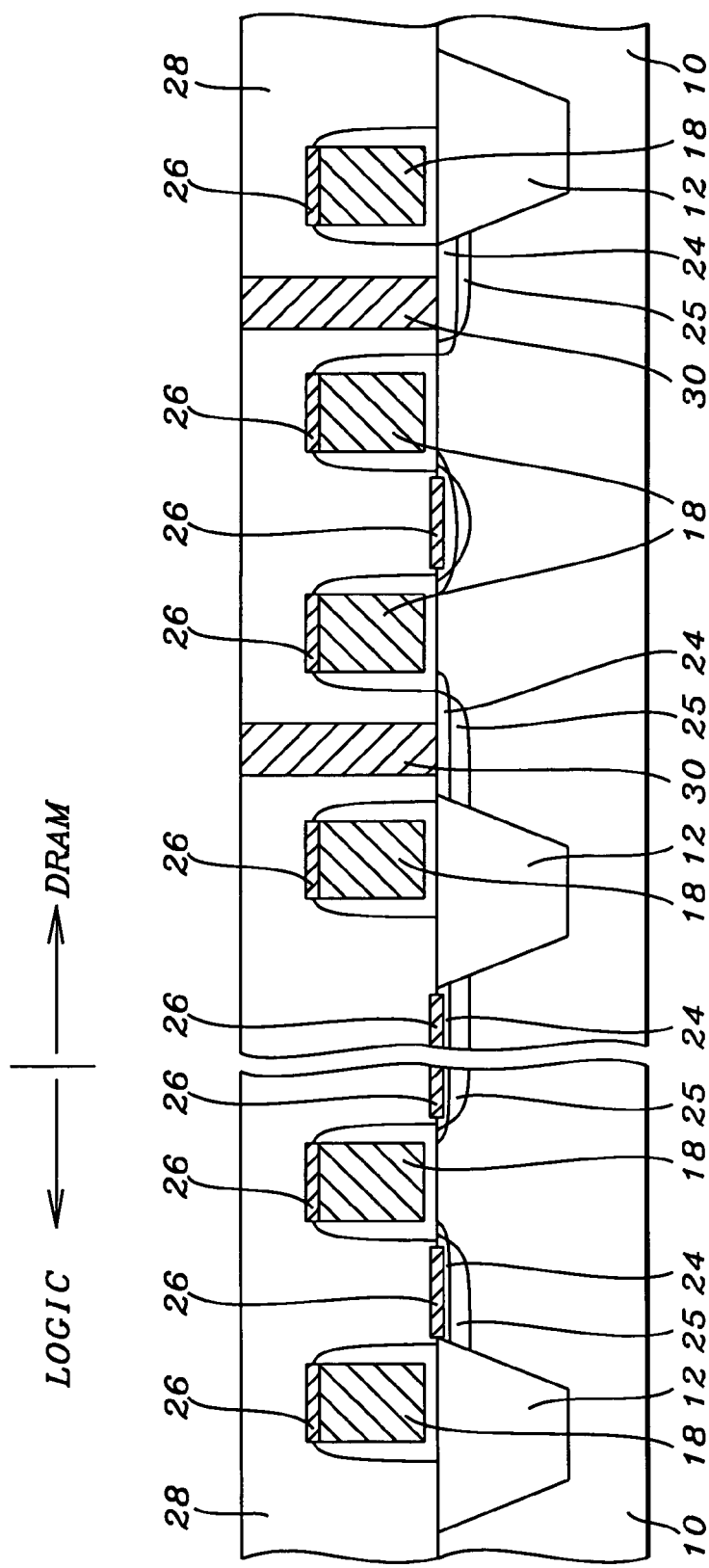
FIGS. 3 through 5 are schematic cross-sectional views showing the sequence of process steps for making contact openings of varying depths, by a first embodiment, for making a logic/memory circuit without having overetched contacts to the substrate, while having low-contact resistance openings to the top electrode of a stacked capacitor.

Referring now to FIG. 3, the method begins by providing a semiconductor substrate 10, a portion of which is shown in the FIGS. FIG. 3 shows a schematic cross-sectional view of the substrate having a logic region labeled "Logic" for logic circuits on the left, and a memory region labeled "DRAM" for DRAM circuits on the right. For practical reasons, only two DRAM cells each having a stacked capacitor are depicted of the multitude of memory cells formed in an array of cells. The preferred substrate 10 is a P$^-$ doped single-crystal silicon having a <100> crystallographic orientation. Field oxide regions 12 are formed surrounding and electrically isolating device areas in both the logic and memory regions. For advanced high-density circuits the preferred field oxide 12 is a Shallow Trench Isolation (STI). Briefly, the STI 12 is formed by etching trenches in the field oxide areas on the substrate to a depth of between about 2000 and 6000 Angstroms. The trenches are filled with an insulating material, such as chemical-vapor-deposited silicon oxide (CVD-SiO$_2$). The STI is made planar with the surface of the substrate 10, for example, by using a planarizing etch-back technique or by chemical-mechanical polishing (CMP).

Referring still to FIG. 3, FETs are formed in the device areas. Briefly the FETs are formed by growing a gate oxide 16 on the device areas of the substrate. A doped polysilicon layer is deposited and patterned to form gate electrodes 18. Then lightly doped source/drain areas 24 are implanted in the substrate, self-aligned to the gate electrodes 18. Sidewall spacers 20 are formed on the gate electrodes 18 by depositing and anisotropically etching back a CVD oxide, such as silicon oxide. A second implant is used to form the source/drain contact areas 25 adjacent to the sidewall spacers 20. For CMOS devices both N- and P-channel FETs can be formed by providing N wells and P wells (not shown) in the substrate. As circuit density increases and device feature sizes decrease, it is desirable to form very shallow diffused junctions for the source/drain contact areas to achieve improved performance. However, during subsequent processing when contact openings are etched, the shallow diffused junctions can be easily damaged. Next, to provide good ohmic contacts to the polysilicon gate electrodes 18 and to the diffused regions 25, a self-aligned silicide (salicide) process is used, which consists of depositing a relatively thin metal 26 that is annealed to selectively react with the silicon in the gate electrodes 18 and on the substrate 10. The unreacted metal on SiO$_2$ surfaces is then removed to form the self-aligned contacts. Next, a first insulating layer 28 is deposited on the substrate. Layer 28 is preferably SiO$_2$ deposited by chemical vapor deposition. The first insulating layer 28 is then planarized, for example by CMP, to have a thickness of between about 3000 and 8000 Angstroms to the substrate surface 10. Alternatively layer 28 can be a borophosphosilicate glass (BPSG). Node contact openings are then etched in the planar first insulating layer 28 to the devices in the memory region, and node contacts 30 are formed in the node contact openings for capacitor bottom electrodes. For example, a doped polysilicon layer can be deposited and polished or etched back to form the node contacts 30.

Figure 4:
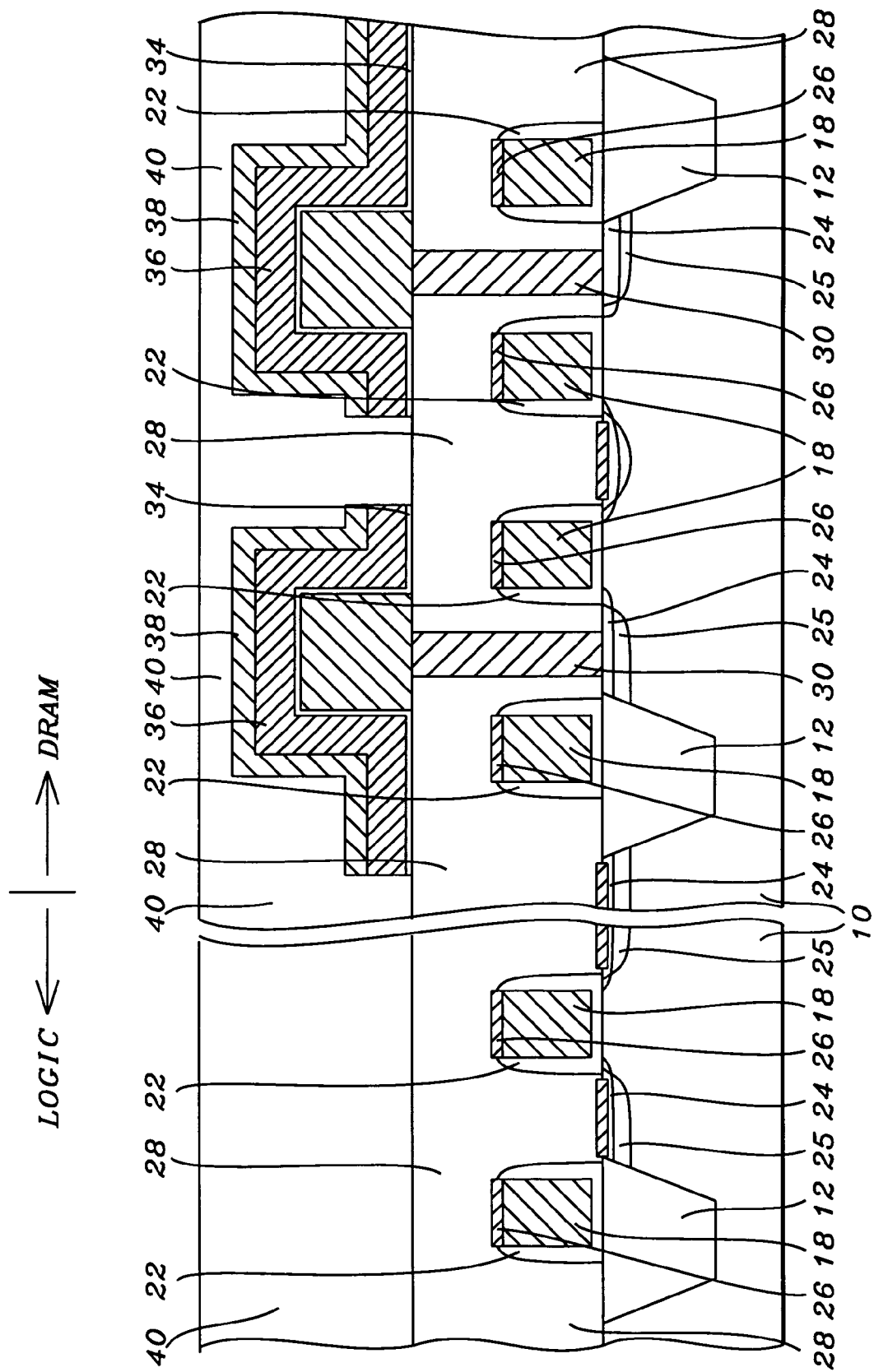

Referring to FIG. 4, a first conducting layer is deposited and patterned to form bottom electrodes 32 over the node contacts 30. For example, the first conducting layer can be a doped polysilicon deposited to a thickness of between about 2000 and 15000 Angstroms. Conventional photolithographic techniques and anisotropic plasma etching are used to pattern the first conducting layer. For example, the etching can be carried out using reactive ion etching and an etchant gas containing chlorine species. Next, a stacked layer comprised of an interelectrode dielectric layer 34, a second conducting layer 36, and an anti-reflective coating 38 is deposited sequentially over the bottom electrodes 32. The interelectrode dielectric layer 34 is preferably silicon oxide/silicon nitride/silicon oxide (ONO). When the bottom electrode 32 is polysilicon, the ONO can be formed by growing a thin thermal SiO$_2$, forming a Si$_3$N$_4$ on the surface, and then reducing the Si$_3$N$_4$ to form a SiO$_2$ layer. The ONO is formed to a preferred thickness of between about 20 and 150 Angstroms. Alternatively, other high-dielectric materials, such as tantalum pentoxide, can be included in layer 34 to increase capacitance. The second conducting layer 36 is a material such as doped polysilicon, titanium nitride (TiN), tantalum nitride (TaN), ruthenium (Ru), or tungsten nitride (WN), and is deposited to a preferred thickness of between about 50 and 3000 Angstroms. The ARC layer 38 is then deposited on the second conducting layer 36. Layer 38 is a material such as silicon oxynitride, titanium nitride, or tantalum nitride. The ARC layer 38 is deposited to a thickness that minimizes the optical reflections and to improve image fidelity when exposing and etching the stacked layer (34, 36, 38) to form the capacitor top electrodes. More specifically, the ARC layer 38 is deposited to a thickness of between about 100 and 1000 Angstroms. A photoresist etch mask (not shown) is used to pattern the stacked layer to form the top electrodes 36 having the ARC layer 38 on the surface. During etching the sidewalls of the top electrodes are exposed. After completing the top electrodes, a second insulating layer 40 is deposited on the substrate and over the top electrodes 36. The second insulating layer 40 is preferably SiO$_2$ deposited by chemical vapor deposition to a preferred thickness of between about 3000 and 2000 Angstroms. The second insulating layer 40 is then planarized, for example by CMP, to have a thickness of between about 2000 and 6000 Angstroms over the top electrodes 36. Alternatively layer 40 can be a borophosphosilicate glass.

Figure 5:
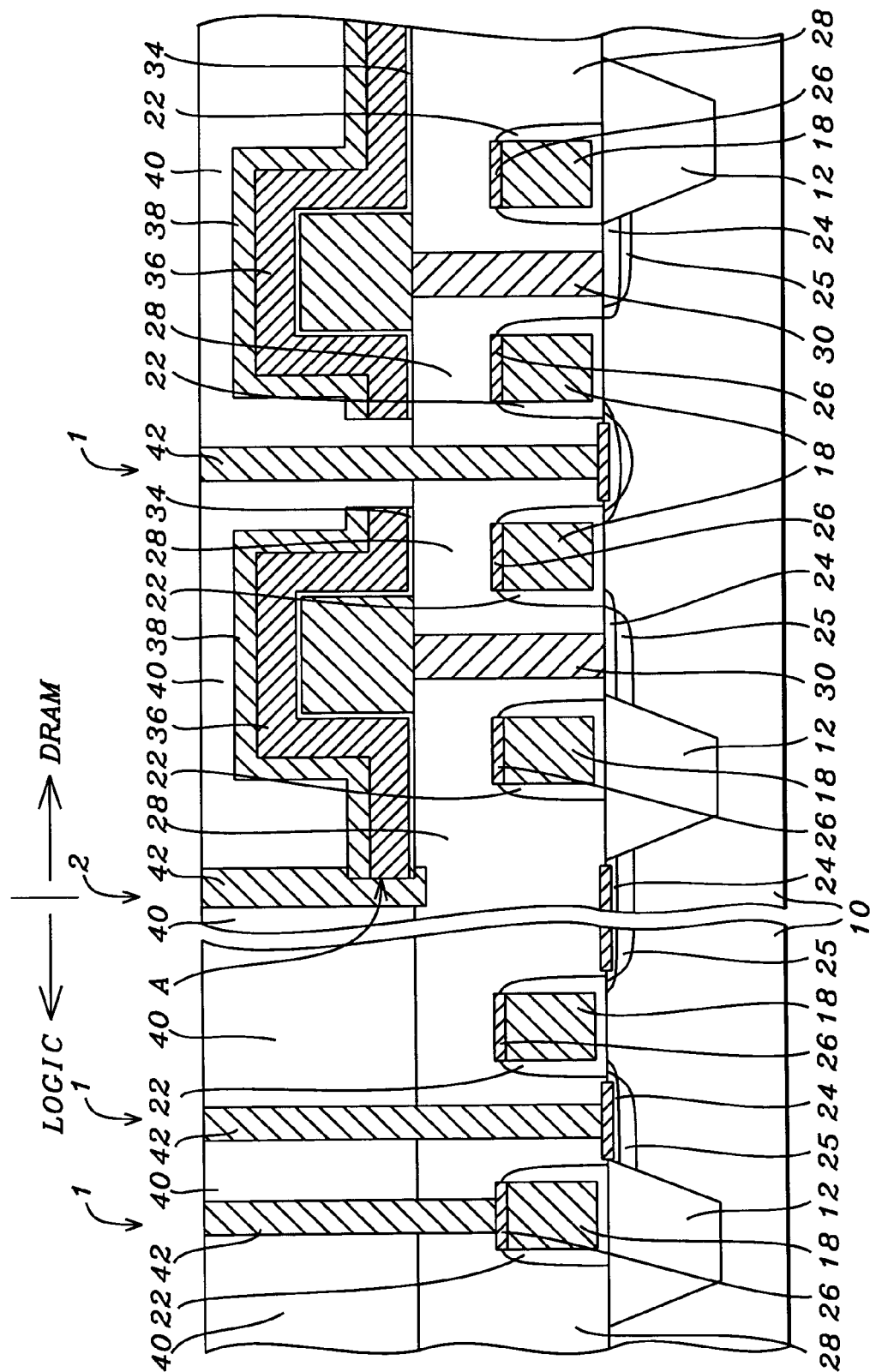

Referring to FIG. 5, one key feature of this invention is to use a single masking step to etch contact openings 1 of varying depths in the second insulating layer 40 and first insulating layer 28 for contacts to the FET gate electrodes 18 and to source/drain contact areas 25 on the substrate in the logic region and memory region having the salicide layer 26 on the surface. The etching is carried out, for example, using anisotropic plasma etching and an etchant gas mixture such as one that contains a fluorine etch species. A second key feature of this invention is to modify the design of the etch mask (not shown) to etch contact openings 2 that extend over and along the edge of the top electrodes 36 to expose the sidewall area A of the second conducting layer, and to provide a means for forming contacts having low-contact resistance to sidewalls of the top electrodes 36. This modified etch-mask design allows the contact openings 1 to be etched to the substrate without overetching and causing damage to the contacts on the substrate, while providing openings 2 that extend along the edge of the capacitor top electrodes to provide for low-resistance contacts. The contact openings 1 and 2 are filled with a conducting material 42, such as tungsten. Layer 42 is then polished or etched back to the surface of the second insulating layer 40 to complete the contacts.

Figure 6:
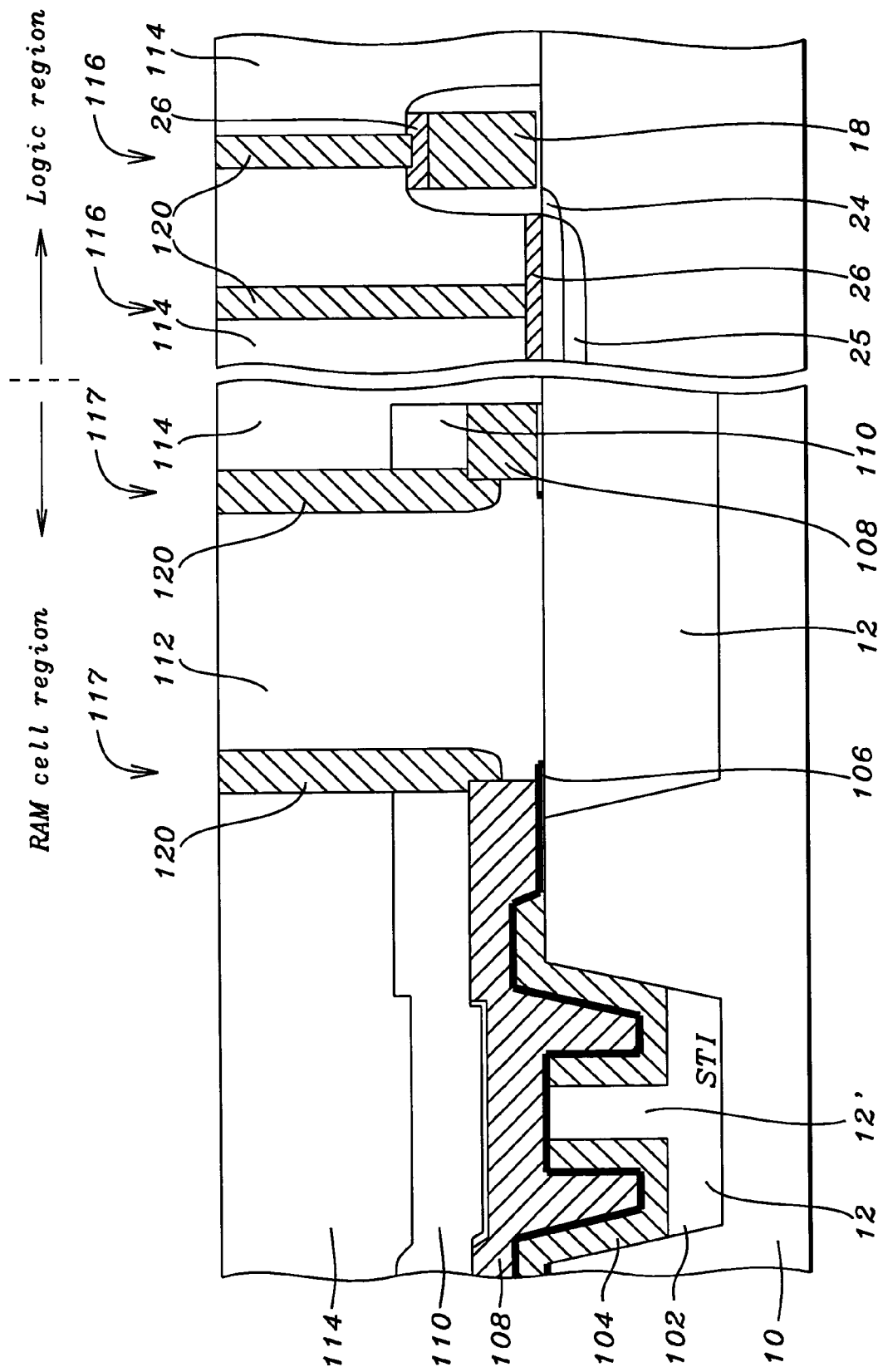

Referring to FIG. 6, a second embodiment of this invention is now described for making contact openings of varying depths in an insulating layer on a substrate for merged logic/memory having trench capacitors. However, in this embodiment the logic region is depicted on the right of FIG. 6 and the memory region is depicted on the left. The method begins similar to the first embodiment. After forming the trench isolation 12, semiconductor devices, such as FETs having gate electrodes 18, which include shallow lightly doped source/drain areas 24, and shallow source/drain contact areas 25, are formed in device areas, as in the first embodiment.

Still referring to FIG. 6, trench capacitors are formed in the shallow trench isolation 12 in the memory region (RAM) by forming recesses 102 in the STI 12. The recesses are preferably etched to a depth of between about 500 and 4000 Angstroms. The STI within the recess 102 can have raised portions 12' to increase the capacitor area thereby increasing capacitance. Next, a conformal first conducting layer 104 is deposited. Layer 104 is preferably doped polysilicon and is deposited to a thickness of at least about 500 Angstroms. Layer 104 is patterned over the recesses to form capacitor bottom electrodes 104.

Continuing with FIG. 6, a stacked layer comprised of an interelectrode dielectric layer 106, a second conducting layer 108, and an anti-reflective coating 110 is deposited sequentially over the bottom electrodes 104. The interelectrode dielectric layer 106 is preferably silicon oxide/silicon nitride/silicon oxide (ONO). When the bottom electrode 104 is polysilicon, the ONO can be formed by growing a thin thermal $SiO_2$, forming a $Si_3N_4$ on the surface, and then reducing the $Si_3N_4$ to form a $SiO_2$ layer. The ONO is formed to a preferred thickness of between about 20 and 150 Angstroms. Alternatively, other high-dielectric materials, such as tantalum pentoxide, can be included in layer 106 to increase capacitance. The second conducting layer 108 is a material such as doped polysilicon, titanium nitride, tantalum nitride, tungsten nitride, or ruthenium, and is deposited to a preferred thickness of between about 50 and 3000 Angstroms. The ARC layer 110 is then deposited on the second conducting layer 108. Layer 110 is a material such as silicon oxynitride, titanium nitride, or tantalum nitride. The ARC layer 110 is deposited to a thickness that minimizes the optical reflections and to improve image fidelity when exposing and etching the stacked layer (106, 108, 110) to form the capacitor top electrodes. A photoresist etch mask (not shown) is used to pattern the stacked layer to form the top electrodes 108 having the ARC layer 110 on the surface.

Figure 7:
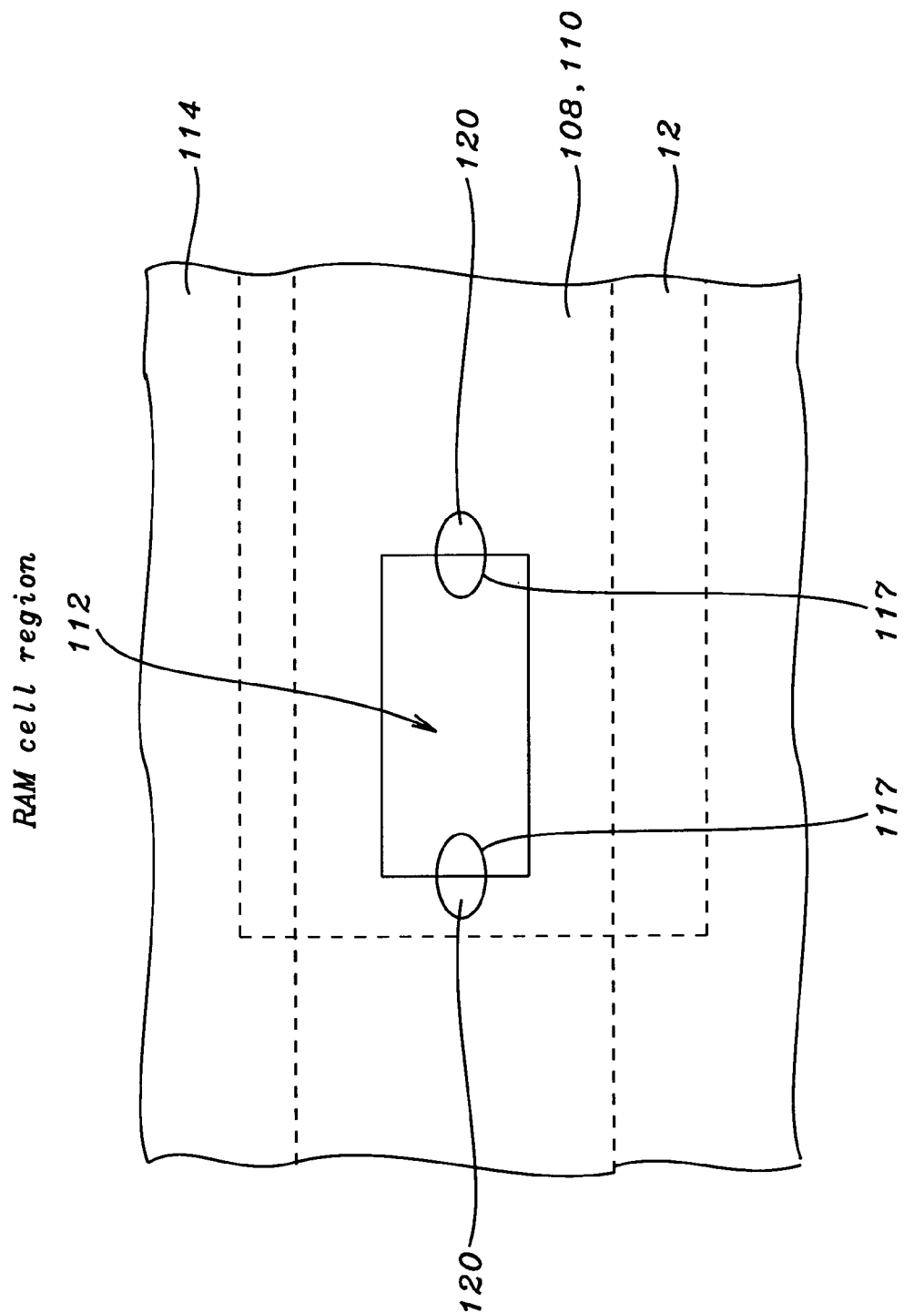

As shown in FIG. 6 and in the top view of FIG. 7, a key feature by the second embodiment is to form open areas 112 in the stacked layer during patterning of the top electrodes. In the top view of FIG. 7 only a portion over the open areas 112 is shown to simplify the drawing and to depict the novel feature of the invention. During the patterning the sidewalls of the second conducting layer 108 are exposed within the open areas 112. An insulating layer 114, such as $SiO_2$ and/or BPSG, is deposited on the substrate and over the top electrodes having ARC 110. The insulating layer 114 is then planarized to have a thickness of between about 3000 and 8000 Angstroms over the top electrodes. Another key feature is to use a novel mask design and a single masking step to etch contact openings 116 of varying depths in the planar insulating layer 114 for contacts to the FETs on the substrate 10, and concurrently etching contact openings 117 in the memory regions (RAM) that extend over and along the edge of the top electrodes 108 in the open areas 112 to expose the second conducting layer 108 (top electrodes). The contact openings 117 are formed on opposite edges of the top electrode in the open area 112 to provide for increased latitude in alignment tolerance. This etching step allows one to etch contact openings 116 to the substrate without overetching the shallow junctions 25, while providing a means for forming contact openings 117 having low-contact resistance to the sidewalls of the top electrodes 108 can be made. The contact openings 116 and 117 are filled with a conducting material 120, such as tungsten. Layer 120 is then polished or etched back to the surface of the insulating layer 114 to complete the contacts 120.

Referring to FIGS. 8A and 8B, to better appreciate the advantages of the invention, FIG. 8A shows a cross-sectional view of misaligned contact openings 117 over a portion of the substrate having an open area 112. When the contact opening 117 is misaligned to the left (117L), the contact opening on the left remains in the ARC layer and forms a poor contact, while the contact opening 117R extends over the side of the top electrode 108 and forms a good contact. And vice versa, if the contact openings 117 are misaligned to the right, then opening 117L forms a good contact, while opening 117R forms a poor contact. FIG. 8B is a top view showing the layout of the contact openings 117 misaligned to the left.

Figure 9:
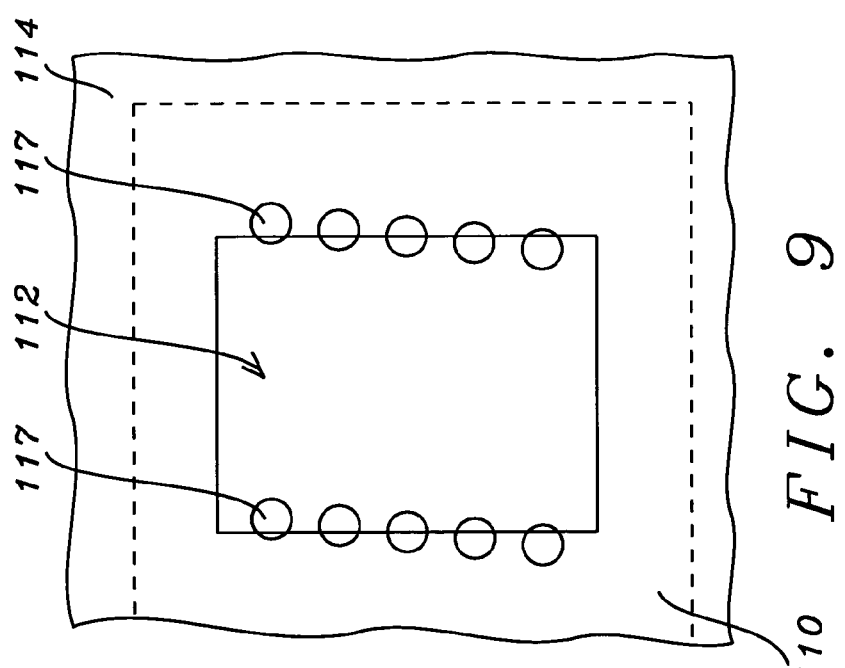

To further increase the latitude in alignment tolerances, a series of contact openings 117 are formed in the insulating layer 114 along the edges of the top electrode, as shown in the top view of FIG. 9. More specifically, the series of contact openings are skewed along the edges of the top electrode 108 in the open area 112.

Figure 10:
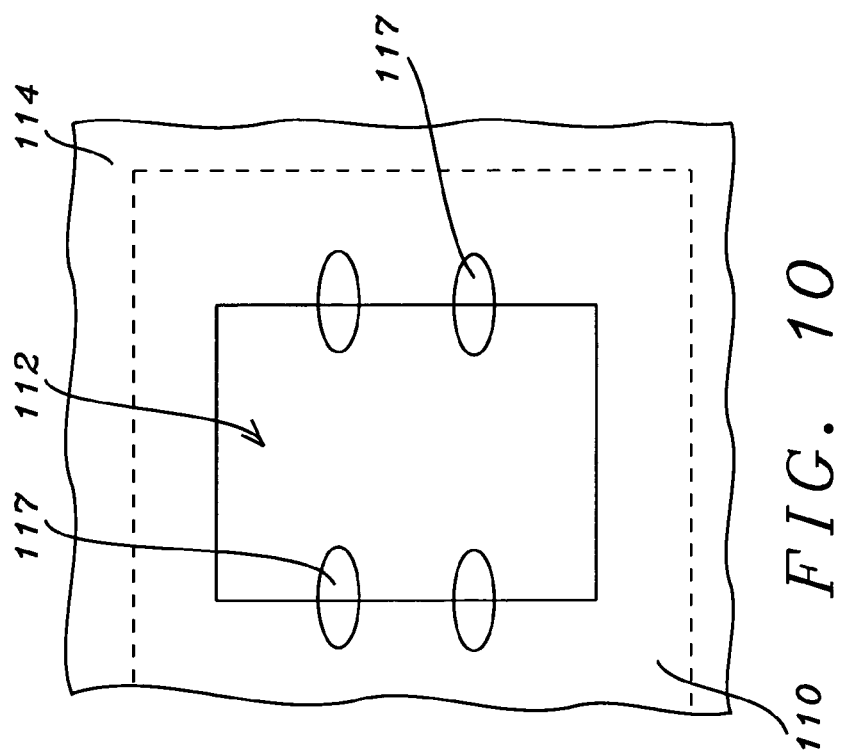
FIGS. 9 and 10 are schematic top views showing the sequence of process steps for making contact openings that are skewed and elongated normal to the edge of a capacitor top electrode, respectively, by a second embodiment, for relaxing the alignment tolerance.

Still another approach for increasing the latitude in alignment tolerances is to form a series of elongated contact openings 117 in the insulating layer 114 along the edges of the top electrode 108, as shown in the top view of FIG. 10. More specifically, the series of contact openings 117 are elongated normal to the edge of the patterned second conducting layer 108 can be formed.

While the invention has been particularly shown and described with reference to the preferred embodiments thereof, it will be understood by those skilled in the art that various changes in form and details may be made without departing from the spirit and scope of the invention.

What is claimed is:

1. A planar insulating layer with contact openings on a substrate having device areas comprised of:
   a conducting layer having an anti-reflective coating on top surface and patterned to have open areas on said substrate, wherein said patterned conducting layer is the top electrode of a capacitor;
   said planar insulating layer on said patterned conducting layer having said contact openings of varying depths to said device areas;
   some of said contact openings extending down to and over an edge of said patterned conducting layer within said opening areas for forming low-resistance contacts to said edge of said patterned conducting layer, wherein at least two of said contact openings extending down to and over an edge of said patterned conducting layer within said opening areas are etched over said edge of said patterned conductive layer in said opening areas on opposite sides of said open areas to allow for more relaxed alignment tolerances, wherein said patterned conducting layer is the top electrode of a capacitor; whereby at least one opening is filled with a conductive material that directly abuts a sidewall of the anti-reflective coating and the patterned conductive layer.

2. The structure of claim 1, wherein a multiple of said contact opening are formed in series that is skewed to said edge of said patterned conducting layer on opposite side of said opening areas to allow for more relaxed alignment tolerance.

3. The structure of claim 1, wherein a multiple of said contact openings are etched in series along said edge of said patterned conducting layer in said open areas, and wherein said contact openings are elongated normal to said edge of said patterned conducting layer in said opening areas to allow for more relaxed alignment tolerance.

4. The structure of claim 1, wherein said anti-reflective coating is material selected form the group that includes silicon oxynitride, titanium nitride, and tantalum nitride, and is deposited to a thickness that minimizes the optical reflectivity during photoresist exposure.

5. An integrated circuit, comprising:
a substrate;
a first device and a second device overlying a part of the substrate, wherein the first device having a plurality of contact regions formed in the substrate and the second device comprises a conductive layer having an overlying anti-reflective coating;
a first insulating layer overlying the substrate and the first and second device;
at least one first opening through the first insulating layer, exposing a top surface of one of the contact regions; and
at least one second opening in the first insulating layer, exposing an edge of the conductive layer having an overlying anti-reflective coating of the second device; whereby at least one opening is filled with a conductive material that directly abuts a sidewall of the anti-reflective coating and the patterned conductive layer.

6. The integrated circuit of claim 5, wherein the at least one first opening has uniform depths to the first insulating layer.

7. The integrated circuit of claim 5, wherein the at least one second opening has varying depths to the first insulating layer.

8. The integrated circuit of claim 5, wherein the first device is a field effect transistor (FET) and the contact region is a source/drain region of the first device.

9. The integrated circuit of claim 5, wherein the second device is a capacitor and the conductive layer is a top electrode of the second device.

10. The integrated circuit of claim 5, wherein the second device is adjacent to the first device.

11. The integrated circuit of claim 5, further comprising a plurality of first and second openings, wherein the first openings are substantially disposed over one of the contact regions of the first device and the second openings are substantially disposed over the edge of the conductive layer having an overlying anti-reflective coating of the second device to allow more relaxed alignment tolerance.

12. An integrated circuit, comprising:
a substrate;
a first device overlying a first part of the substrate;
a second device overlying a second part of the substrate, wherein the second device comprises a conductive layer of a capacitor having an overlying anti-reflective coating;
at least one first contact connecting a top surface of the first device; and
at least one second contact connecting a sidewall of the conductive layer having the overlying anti-reflective coating of the second device.

13. A planar insulating layer with contact openings on a substrate having device areas comprised of:
a conducting layer having an anti-reflective coating on top surface and patterned to have open areas on said substrate;
said planar insulating layer on said patterned conducting layer having said contact openings of varying depths to said device areas;
some of said contact openings extending down to and over an sidewall of said patterned conducting layer within said opening areas for forming low-resistance contacts to said sidewall of said patterned conducting layer, wherein at least two of said contact openings extending down to and over an edge of said patterned conducting layer within said opening areas are etched over said sidewall of said patterned conductive layer in said opening areas on opposite sides of said open areas to allow for more relaxed alignment tolerances; whereby at least one opening is filled with a conductive material that directly abuts a sidewall of the anti-reflective coating and the patterned conductive layer.

14. The structure of claim 13, wherein a multiple of said contact opening are formed in series that is skewed to said edge of said patterned conducting layer on opposite side of said opening areas to allow for more relaxed alignment tolerance.

15. The structure of claim 13, wherein a multiple of said contact openings are etched in series along said edge of said patterned conducting layer in said open areas, and wherein said contact openings are elongated normal to said sidewall of said patterned conducting layer in said opening areas to allow for more relaxed alignment tolerance.

16. The structure of claim 13, wherein said patterned conducting layer is the top electrode of a capacitor.

17. The structure of claim 13, wherein said anti-reflective coating is material selected form the group that includes silicon oxynitride, titanium nitride, and tantalum nitride, and is deposited to a thickness that minimizes the optical reflectivity during photoresist exposure.

* * * * *